US009859986B2

(12) United States Patent
Tanaka et al.

(10) Patent No.: US 9,859,986 B2
(45) Date of Patent: Jan. 2, 2018

(54) OPTICAL RECEIVER, ACTIVE OPTICAL CABLE, AND CONTROL METHOD FOR OPTICAL RECEIVER

(71) Applicant: FUJIKURA LTD., Tokyo (JP)

(72) Inventors: Takayuki Tanaka, Chiba (JP); Minako Hayashi, Chiba (JP)

(73) Assignee: FUJIKURA LTD., Tokyo (JP)

( * ) Notice: Subject to any disclaimer, the term of this patent is extended or adjusted under 35 U.S.C. 154(b) by 6 days.

(21) Appl. No.: 15/170,185

(22) Filed: Jun. 1, 2016

(65) Prior Publication Data

US 2016/0285563 A1    Sep. 29, 2016

Related U.S. Application Data

(63) Continuation of application No. PCT/JP2015/079191, filed on Oct. 15, 2015.

(30) Foreign Application Priority Data

Oct. 15, 2014  (JP) ................................ 2014-211225

(51) Int. Cl.
  *H01J 40/14*    (2006.01)
  *H04B 10/69*   (2013.01)
  (Continued)

(52) U.S. Cl.
  CPC .............. *H04B 10/697* (2013.01); *G01J 1/44* (2013.01); *H03F 3/087* (2013.01);
  (Continued)

(58) Field of Classification Search
  CPC .......... H03F 3/08; H03F 3/45; H03F 3/45076; H04B 10/69; H04B 10/693; H04B 10/695
  (Continued)

(56) References Cited

U.S. PATENT DOCUMENTS 6,115,163 A    9/2000  Nobuhara
2003/0165207 A1   9/2003  Noguchi et al.
(Continued)

FOREIGN PATENT DOCUMENTS

JP    08018429 A    1/1996
JP    10209975 A    8/1998
(Continued)

OTHER PUBLICATIONS

Japanese Office Action for corresponding Japanese Patent Application No. 2016-507948.
(Continued)

*Primary Examiner* — Kevin Pyo
(74) *Attorney, Agent, or Firm* — Sughrue Mion, PLLC

(57) ABSTRACT

The present disclosure includes a photodetector element (11) that converts an optical signal into an electric current signal; a transimpedance amplifier (12a) that converts the electric current signal into a voltage signal; a differential amplifier (12d) that converts the voltage signal into a differential signal, by performing differential amplification of a difference between the voltage signal and a threshold voltage; an LOS detection circuit that detects a no-signal section of the optical signal; and an MCU that repeatedly executes offset cancellation processing, the offset cancellation processing including threshold voltage change processing in which the threshold voltage is changed such that an offset voltage of the differential signal is reduced, the MCU 13 skipping the threshold voltage change processing in the no-signal section.

10 Claims, 9 Drawing Sheets

(51) Int. Cl.
*G01J 1/44* (2006.01)
*H03F 3/08* (2006.01)
*H03F 3/45* (2006.01)

(52) U.S. Cl.
CPC ..... *H03F 3/45475* (2013.01); *H03F 3/45968* (2013.01); *H04B 10/69* (2013.01); *G01J 2001/444* (2013.01); *H03F 2200/405* (2013.01); *H03F 2203/45212* (2013.01)

(58) Field of Classification Search
USPC .............. 250/214 R, 214 A, 214 LA, 214 C; 330/110, 308
See application file for complete search history.

(56) References Cited

U.S. PATENT DOCUMENTS

| | | | |
|---|---|---|---|
| 2003/0218508 A1* | 11/2003 | Chiou | H03F 3/087 330/308 |
| 2005/0062543 A1 | 3/2005 | Mayampurath et al. | |
| 2007/0081827 A1 | 4/2007 | Ide et al. | |
| 2009/0058516 A1 | 3/2009 | Nagao et al. | |
| 2009/0232519 A1 | 9/2009 | Ide et al. | |
| 2009/0310979 A1 | 12/2009 | Hara | |
| 2011/0273233 A1* | 11/2011 | McLeod | H03F 3/45973 330/259 |
| 2012/0241599 A1 | 9/2012 | Uemura et al. | |
| 2014/0193164 A1 | 7/2014 | Ide | |

FOREIGN PATENT DOCUMENTS

| | | |
|---|---|---|
| JP | 11112439 A | 4/1999 |
| JP | 2003258924 A | 9/2002 |
| JP | 2002354054 A | 12/2002 |
| JP | 2005037301 A | 2/2005 |
| JP | 2007110231 A | 4/2007 |
| JP | 2008-109559 A | 5/2008 |
| JP | 2008-211376 A | 9/2008 |
| JP | 2009049488 A | 3/2009 |
| JP | 2009053110 A | 3/2009 |
| JP | 2011-23936 A | 2/2011 |
| JP | 2012204885 A | 10/2012 |
| JP | 2014-135646 A | 7/2014 |

OTHER PUBLICATIONS

International Search Report of PCT/JP2015/079191, dated Dec. 28, 2015. [PCT/ISA/210].
Written Opinion of PCT/JP2015/079191, dated Dec. 28, 2015. [PCT/ISA/237].
Communication dated Sep. 6, 2016, from the Japanese Patent Office in counterpart application No. 2016-507948.
Communication dated Jun. 6, 2017, from the Japanese Patent Office in counterpart Japanese application No. 2016-197977.
Communication dated Oct. 2, 2017 from the European Patent Office in counterpart European application No. 15850335.9.
Communication dated Oct. 10, 2017 from the Japanese Patent Office in counterpart Japanese application No. 2016-197977.

* cited by examiner

OPTICAL RECEIVER, ACTIVE OPTICAL CABLE, AND CONTROL METHOD FOR OPTICAL RECEIVER

CROSS-REFERENCE TO RELATED APPLICATIONS

This application is a Continuation of PCT International Application No. PCT/JP2015/079191 filed in Japan on Oct. 15, 2015, which claims the benefit of Patent Application No. 2014-211225 filed in Japan on Oct. 15, 2014, the entire contents of which are hereby incorporated by reference.

TECHNICAL FIELD

The present invention relates to (i) an optical receiver that receives an optical signal, converts the optical signal thus received into a voltage signal, and then outputs the voltage signal outside the optical receiver, (ii) an active optical cable including such an optical receiver, and (iii) a control method for such an optical receiver.

BACKGROUND ART

Active optical cables have been garnering attention as a transmission medium to serve as an alternative to metal cables. An active optical cable is configured such that it includes (i) a cable containing an optical fiber; and (ii) a pair of connectors respectively provided on both ends of the cable. One of the connectors functions as an optical transmitter. This optical transmitter converts, into an optical signal, a voltage signal externally supplied (e.g., from a data center computer) and then transmits the optical signal. The other connector serves as an optical receiver. This optical receiver converts a received optical signal into a voltage signal and then outputs the voltage signal outside the optical receiver (e.g., to a data center storage device). By making each of the connectors function as both an optical receiver and an optical transmitter, it is possible to realize bidirectional communication using the active optical cable.

FIG. 9 illustrates an optical receiver 2. The optical receiver 2 is a conventional optical receiver that can be used as a connector for an active optical cable. The optical receiver 2 includes (i) a photodetector element 21 that converts an optical signal into an electric current signal, and (ii) a receiving circuit 22 that converts the electric current signal into a voltage signal.

The receiving circuit 22 is configured such that it includes a transimpedance amplifier 22a, differential amplifiers 22b through 22e, a low-pass filter 22f, and an error amplifier 22g.

The transimpedance amplifier 22a converts, into a voltage signal (single end), an electric current signal outputted from the photodetector element 21. The differential amplifier 22b performs differential amplification of the difference between (i) a voltage signal outputted from the transimpedance amplifier 22a and (ii) a threshold voltage Vth. By performing this differential amplification, the differential amplifier 22b obtains a differential signal consisting of a positive phase signal and a negative phase signal. The group of differential amplifiers 22c through 22e performs differential amplification of the differential signal outputted from the differential amplifier 22b.

If the output voltage of the transimpedance amplifier 22a is Vtia, then the differential amplifier 22b has a positive phase output voltage V1p which is expressed as V1ocm+a1×(Vtia−Vth)/2, and a negative phase output voltage V1n which is expressed as V1ocm−a1×(Vtia−Vth)/2. Here, V1ocm is an output common mode voltage (a predetermined value) of the differential amplifier 22b, and a1 is a gain (a predetermined value) of the differential amplifier 22b.

An average value of a high level and a low level of a voltage signal outputted by the transimpedance amplifier 22a is, hereinafter, also referred to as an "average output level of transimpedance amplifier 22a." In a case where the average output level of the transimpedance amplifier 22a is equal to a threshold voltage Vth, the positive phase signal and the negative phase signal outputted from the differential amplifier 22b have waveforms which become symmetrical to each other with respect to the output common mode voltage V1ocm. However, in a case where the power of the optical signal being received fluctuates and the transimpedance amplifier 22a has an average output level that is not equal to the threshold voltage Vth, the positive phase signal and the negative phase signal have respective waveforms which become asymmetrical to each other with respect to the output common mode voltage V1ocm. This sort of asymmetry causes distortion of a waveform of an output signal of the optical receiver 2.

The low-pass filter 22f and the error amplifier 22g are each a component for avoiding the above problem. The low-pass filter 22f performs smoothing of (i) the positive phase signal outputted from the differential amplifier 22c and (ii) the negative phase signal outputted from the differential amplifier 22c. The error amplifier 22g receives: (i) a smoothed positive phase signal (DC component of the positive phase signal) outputted from the low-pass filter 22f; and (ii) a smoothed negative phase signal (DC component of the negative phase signal) outputted from the low-pass filter 22f. The error amplifier 22g then integrates the difference between the respective values of these two smoothed signals, i.e., an offset voltage of the differential signal outputted from the differential amplifier 22c. A resulting integration value of the offset voltage outputted from the error amplifier 22g is fed back, as a threshold voltage Vth, into a negative phase input of the differential amplifier 22b.

The integration value of the offset voltage outputted from the error amplifier 22g follows the average output level of the transimpedance amplifier 22a. As a result, even if the power of the optical signal being received fluctuates, the abovementioned distortion problem is avoided.

Patent Literature 1 is an example literature disclosing art that cancels an offset voltage of a differential signal.

CITATION LIST

Patent Literature

[Patent Literature 1]
Japanese Patent Application Publication, Tokukai, No. 2008-109559 (Publication Date: May 8, 2008)

SUMMARY OF INVENTION

Technical Problem

Though the aforementioned distortion problem is avoided as described above, conventional optical receivers such as the optical receiver 2 illustrated in FIG. 9 exhibit the problem that immediately after transition of an optical signal from a no-signal section to a signal section, a waveform of an output signal is distorted. The following discussion provides a more detailed explanation of this problem, with reference to FIG. 10.

(a) of FIG. 10 is a waveform chart of an optical signal which is received by the photodetector element 21. (b) of FIG. 10 is a waveform chart of a voltage signal which is outputted by the transimpedance amplifier 22a. Note that (b)

of FIG. 10 also shows a dotted line representing a change, over time, of the threshold voltage Vth outputted by the error amplifier 22g.

The optical signal shown in (a) of FIG. 10 has a pattern consisting of (i) a DATA section (signal section) whose value alternates between a high level and a low level, and (ii) an IDLE section (no-signal section) whose value is constantly an off level. When the photodetector element 21 receives the optical signal shown in (a) of FIG. 10, the transimpedance amplifier 22a outputs the voltage signal shown in (b) of FIG. 10.

As shown in (b) of FIG. 10, an average output level of the transimpedance amplifier 22a differs between the DATA section and the IDLE section. Due to this difference, distortion occurs in the waveform of the output signal of the optical receiver 2. This distortion occurs from the point in time at which the IDLE section has transitioned to the DATA section until the point in time at which the output voltage Vth of the error amplifier 22g catches up to the average output level of the transimpedance amplifier 22a in the DATA section.

Note that in a link-up sequence of serial communication in conformance with SAS (Serial Attached SCSI), an OOB (Out of Band) signal may be sent or received, the OOB signal having a pattern consisting of (i) a DATA section whose value alternates between a high level and a low level, and (ii) an IDLE section whose value is constantly an intermediate level between the high level and the low level. Similarly, in serial communication in conformance with PCIe (PCI Express), a signal may be sent or received, the signal having a pattern consisting of (i) a DATA section in which a high level and a low level repeatedly alternate, and (ii) an EI (Electrical Idle) section in which an intermediate level is maintained. Consequently, using an active optical cable to realize serial communications in conformance with the above two standards requires sending and receiving an optical signal having a pattern such as the one shown in (a) of FIG. 10, for example.

The present invention has been accomplished in view of the above problem. An objective of the present invention is to realize an optical receiver capable of performing offset cancellation while causing no distortion of a waveform of an output signal immediately after transition from a no-signal section to a signal section.

Solution to Problem

In order to solve the above problem, an optical receiver in accordance with the present invention includes: a photodetector element that converts an optical signal into an electric current signal; a transimpedance amplifier that converts the electric current signal into a voltage signal; a differential amplifier that converts the voltage signal into a differential signal, by performing differential amplification of a difference between the voltage signal and a threshold voltage; a no-signal detection circuit that detects a no-signal section of the optical signal; and a control section that repeatedly executes offset cancellation processing, the offset cancellation processing including threshold voltage change processing in which the threshold voltage is changed such that an offset voltage of the differential signal is reduced, the control section skipping the threshold voltage change processing in the no-signal section.

As another way to solve the above problem, a control method for an optical receiver according to the present invention is A control method for an optical receiver, the optical receiver including: a photodetector element that converts an optical signal into an electric current signal; a transimpedance amplifier that converts the electric current signal into a voltage signal; and a differential amplifier that converts the voltage signal into a differential signal, by performing differential amplification of a difference between the voltage signal and a threshold voltage, the control method comprising the steps of: (i) detecting a no-signal section of the optical signal; and (ii) performing control by repeatedly executing offset cancellation processing, the offset cancellation processing including threshold voltage change processing in which the threshold voltage is changed such that an offset voltage of the differential signal is reduced, the step (ii) skipping the threshold voltage change processing in the no-signal section of the optical signal.

Advantageous Effects of Invention

With the present invention, it is possible to perform offset cancellation while causing no distortion of a waveform of an output signal immediately after transition from a no-signal section to a signal section.

Figure 9:
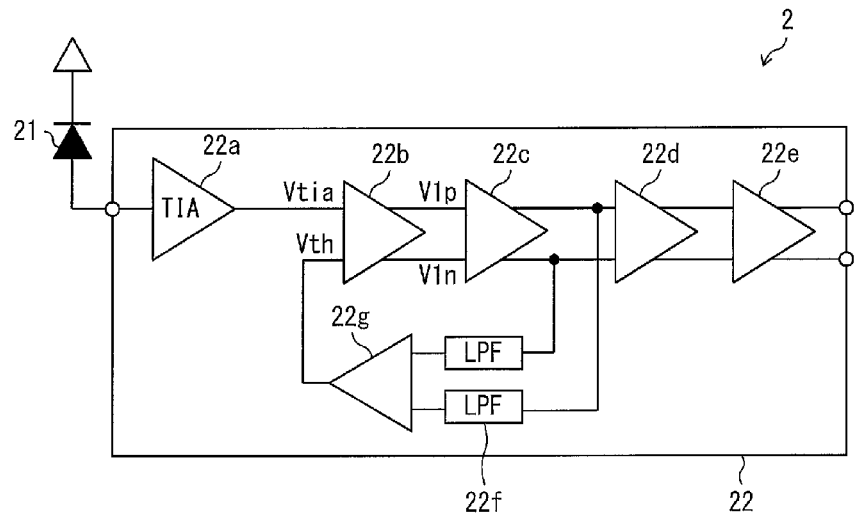
FIG. 9. is a block diagram illustrating a configuration of a conventional optical receiver.
Figure 10:
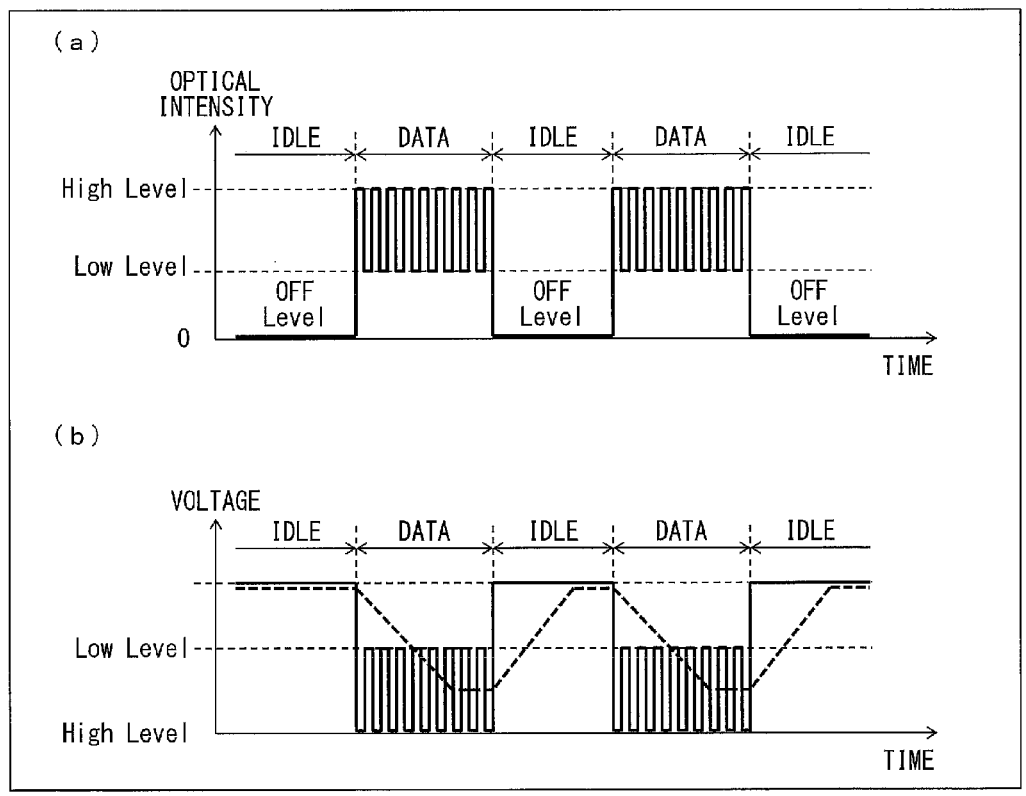

(a) of FIG. 10 is a waveform chart of an optical signal received by a photodetector element of the optical receiver illustrated in FIG. 9. (b) of FIG. 10 is a waveform chart of a voltage signal outputted by a transimpedance amplifier of the optical receiver illustrated in FIG. 9.

DESCRIPTION OF EMBODIMENTS

[Configuration of Optical Receiver]

Figure 1:
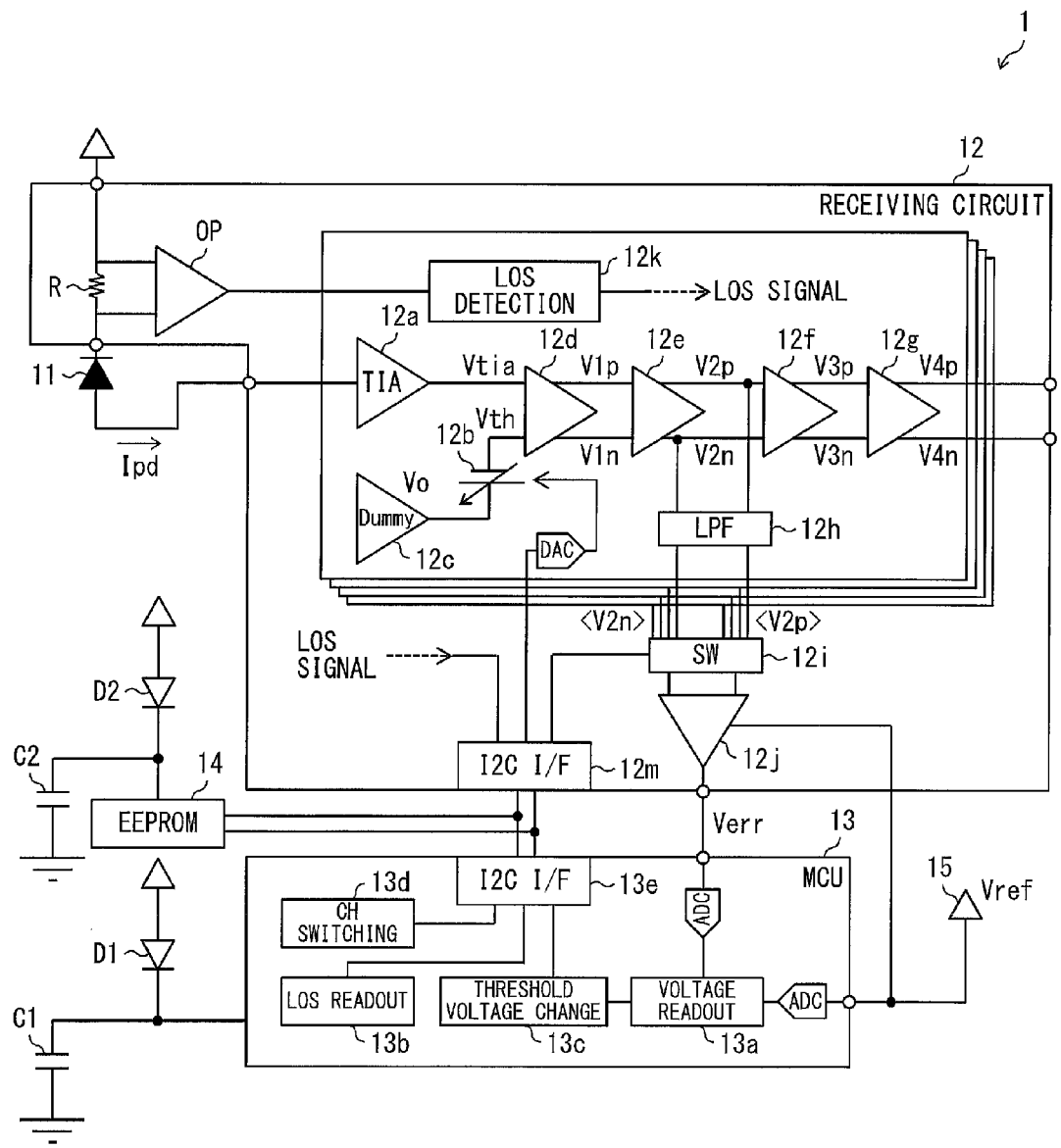
FIG. 1 is a block diagram illustrating a configuration of an optical receiver according to one embodiment of the present invention.

The following discusses a configuration of an optical receiver 1 with reference to FIG. 1. FIG. 1 is a block diagram illustrating a configuration of the optical receiver 1.

The optical receiver 1 is a device that receives an optical signal, converts the optical signal thus received into a voltage signal (in the present embodiment, a differential voltage signal), and outputs, outside the optical receiver 1, the signal thus converted. As illustrated in FIG. 1, the optical receiver 1 includes a photodetector element 11, a receiving circuit 12, an MCU (Micro Controller Unit) 13, a nonvolatile memory 14, and a reference voltage source 15.

The photodetector element 11 is a component for receiving an optical signal and converting the optical signal thus received into an electric current signal. In the present embodiment, the photodetector element 11 is a photodiode (PD). The electric current signal obtained by the photodetector element 11 is supplied to the receiving circuit 12.

The receiving circuit 12 is a component for converting the electric current signal obtained by the photodetector element 11 into a differential voltage signal (hereinafter, referred to as "differential signal"). As illustrated in FIG. 1, the receiving circuit 12 includes a transimpedance amplifier 12a, a variable voltage source 12b, a dummy transimpedance amplifier 12c, differential amplifiers 12d through 12g, a low-pass filter 12h, a switch 12i, an error amplifier 12j, a Loss of Signal (LOS) detection circuit 12k, and an I2C interface 12m.

The transimpedance amplifier 12a converts the electric current signal obtained by the photodetector element 11 into a voltage signal (single end). An output voltage Vtia of the transimpedance amplifier 12a is supplied to a negative phase input terminal of the differential amplifier 12d.

The variable voltage source 12b generates a threshold voltage Vth. A level of the threshold voltage Vth thus generated can be controlled by the MCU 13 through the I2C interface 12m. The threshold voltage Vth generated by the variable voltage source 12b is supplied to a positive phase input terminal of the differential amplifier 12d.

Note that in the present embodiment, the dummy transimpedance amplifier 12c is interposed between the variable voltage source 12b and a ground. This interposition is intended to cancel (i) temperature dependence of the transimpedance amplifier 12a and (ii) power supply voltage dependence of the transimpedance amplifier 12a (i.e., a component of voltage that is included in the output voltage of the transimpedance amplifier 12a and is not dependent on photoelectric current Ipd that flows through the photodetector element 11).

The differential amplifier 12d converts the voltage signal outputted from the transimpedance amplifier 12a into a differential signal. The differential amplifier 12d achieves this conversion by performing differential amplification of the difference between (i) the voltage signal outputted from the transimpedance amplifier 12a, and (ii) the threshold voltage Vth. A positive phase output voltage V1p of the differential amplifier 12d is expressed as V1ocm+a1×(Vtia−Vth)/2. A negative phase output voltage V1n of the differential amplifier 12d is expressed as V1ocm−a1×(Vtia−Vth)/2. Here, V1ocm is an output common mode voltage (a predetermined value) of the differential amplifier 12d, and a1 is a gain (a predetermined value) of the differential amplifier 12d. The differential signal obtained by the differential amplifier 12d is supplied to a group of differential amplifiers 12e through 12g.

The group of differential amplifiers 12e through 12g amplifies the differential signal obtained by the differential amplifier 12d. A differential signal (a positive phase output voltage V2p and a negative phase output voltage V2n) outputted from the differential amplifier 12e, i.e., a first-stage differential amplifier in the group, is supplied to the low-pass filter 12h. A differential signal (a positive phase output voltage V4p and a negative phase output voltage V4n) outputted from the differential amplifier 12g, i.e., from a last-stage differential amplifier in the group, is outputted outside the optical receiver 1.

The low-pass filter 12h performs smoothing of (i) the positive phase signal outputted from the differential amplifier 12e to give a smoothed positive phase signal and (ii) the negative phase signal outputted from the differential amplifier 12e to give a smoothed negative phase signal. The smoothed positive phase signal, i.e., a DC component <V2p> of the positive phase signal outputted from the differential amplifier 12e, is supplied to a positive phase input terminal of the error amplifier 12j. On the other hand, the smoothed negative phase signal, i.e., a DC component <V2n> of the negative phase signal outputted from the differential amplifier 12e, is supplied to a negative phase signal input terminal of the error amplifier 12j.

The error amplifier 12j performs differential amplification of the difference between (i) the smoothed positive phase signal and (ii) the smoothed negative phase signal. An output voltage Verr of the error amplifier 12j is expressed as a2×(<V2p>−<V2n>)+Vref, which is the sum of (i) a reference voltage Vref and (ii) the product a2×(<V2p>−<V2n>) obtained by multiplying an offset voltage Vos=<V2p>−<V2n> by a gain a2 of the error amplifier 12j. Here, the reference voltage Vref is an output voltage of the reference voltage source 15 which is connected to a negative input terminal of the error amplifier 12j. The output voltage Verr (hereinafter, referred to as "error amplifier output") of the error amplifier 12j is supplied into the MCU 13.

The LOS detection circuit 12k identifies a section in which a value of a received optical signal is an off level, i.e., a section in which a light current Ipd flowing through the photodetector element 11 has become equal to or less than a predetermined threshold value (such a section is hereinafter referred to as a "no-signal section"). The predetermined threshold value is set to be, for example, (i) approximately equal to a level of a dark current flowing through the photodetector element 11, or (ii) approximately equal to a photoelectric current flowing through the photodetector element 11 when weak light is received. The LOS detection circuit 12k further generates an LOS signal indicating an identified no-signal section. At the same time, the LOS detection circuit 12k stores a value of the LOS signal thus generated in a register (not illustrated). In the present embodiment, the LOS signal is a digital signal whose value is (i) "1" in a no-signal section and (ii) "0" outside of a no-signal section. Furthermore, in the present embodiment, the register in which a value of the LOS signal is stored is a clear-on-read register, which updates the value after the value has been read out. This means that, in a first readout after a no-signal section has ended, "1" is read out as the value of the LOS signal. Readout of "0" as a value of the LOS signal is limited to a case where a non-LOS state continues from a previous readout to the current readout. The value of the LOS signal stored in this register is read out by the MCU 13 through the I2C interface 12m.

The present embodiment employs a configuration, as illustrated in FIG. 1, in which a resistor R connected in series to the photodetector element 11 has a dropped voltage R×Ipd and this dropped voltage is supplied to the LOS detection circuit 12k through an operational amplifier OP. The LOS detection circuit 12k identifies a no-signal section by referring to an output voltage of the operational amplifier OP.

Note that with the exception of the error amplifier 12j and the I2C interface 12m, the receiving circuit 12 includes 2 or more sets of the abovementioned components adequate for 2 or more channels (in the present embodiment, adequate for 4 channels). The switch 12*i* switches a channel serving as a signal source of a differential signal that is to be supplied to the error amplifier 12*j*. In other words, the differential amplifier 12*e* outputs a differential signal of a channel selected by the switch 12*i*, and the differential signal thus outputted is subsequently supplied to the error amplifier 12*j*.

The MCU 13 is a component for executing offset cancellation processing and includes, as illustrated in FIG. 1, a voltage readout section 13*a*; an LOS readout section 13*b*; a threshold voltage changing section 13*c*; a channel switching section 13*d*; and an I2C interface 13*e*. Here, "offset cancellation processing" refers to processing done to bring the offset voltage Vos closer to 0 [V], i.e., processing that brings the error amplifier 12*j* output voltage Verr closer to the reference voltage Vref. This processing is done by changing a level of the threshold voltage Vth generated by the variable voltage source 12*b*. Note that an explanation of (i) a flow of the offset cancellation processing and (ii) timing of execution of the offset cancellation processing is provided later in reference to a different drawing.

The nonvolatile memory 14 is a component for recording a level of the threshold voltage Vth (more precisely, a numerical value expressing the level of the threshold voltage Vth). In the present embodiment, an EEPROM (registered trademark) is used as the nonvolatile memory 14. The MCU 13 executes threshold voltage write processing in which a level of the threshold voltage Vth is written to the nonvolatile memory 14. This processing is executed when operation of the MCU 13 ends (immediately prior to when operation of the MCU 13 ends), for example, at the time of power-off. The MCU 13 further executes threshold voltage readout processing in which the level of the threshold voltage Vth is read out from the nonvolatile memory 14. This processing is executed when operation of the MCU 13 commences (immediately after operation of the MCU 13 commences), for example, at the time of power-on. The level of the threshold voltage Vth read out from the nonvolatile memory 14 at the time of commencement of the operation (the level of the threshold voltage Vth written to the nonvolatile memory 14 at the time when the last time operation ended) is used by the MCU 13 as an initial value of the threshold voltage Vth in the offset cancellation processing.

In a case where the threshold voltage write processing is executed at the time of power-off, for example, an alarm set off by a power supply monitor IC (not illustrated) may serve as a trigger to commence the threshold voltage write processing, the alarm being set off when a power supply voltage becomes less than a predetermined threshold value. As illustrated in FIG. 1, if a voltage holding circuit including a condenser C1 and a diode D1 is inserted between a power supply and the MCU 13, and, at the same time, another voltage holding circuit including a condenser C2 and a diode D2 is inserted between another power supply and the nonvolatile memory 14, then it becomes possible to make the MCU 13 and the nonvolatile memory 14 operate normally even after a level of the power supply voltage becomes less than a predetermined threshold value.

[Flow of Offset Cancellation Processing]

Figure 2:
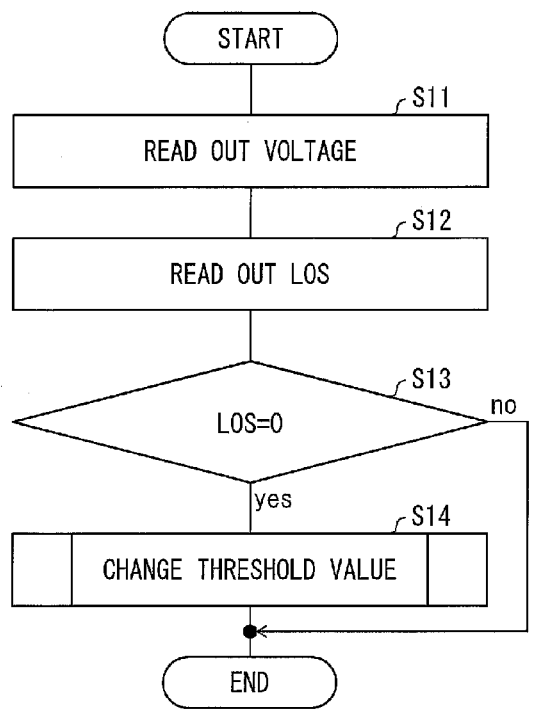
FIG. 2 is a flowchart showing a flow of offset cancellation processing executed by an MCU of the optical receiver illustrated in FIG. 1.

The MCU 13 executes the offset cancellation processing in accordance with the flowchart of FIG. 2. FIG. 2 is a flowchart showing a flow of the offset cancellation processing executed by the MCU 13. The following describes operation of the MCU 13 during each step of the flowchart of FIG. 2.

Step S11 (voltage readout processing): The MCU 13 reads out, through an A/D converter, (i) a voltage Verr outputted by the error amplifier 12*j* and (ii) a reference voltage Vref outputted by the reference voltage source 15. After this, the MCU 13 proceeds to step S12 of the offset cancellation processing. The voltage readout section 13*a* of the MCU 13 illustrated in FIG. 1 is a section for executing this voltage readout processing.

Step S12 (LOS readout processing): The MCU 13 reads out, through the I2C interface 13*e*, a value of an LOS signal generated by the LOS detection circuit 12*k*. After this, the MCU 13 proceeds to step S13 of the offset cancellation processing. The LOS readout section 13*b* of the MCU 13 illustrated in FIG. 1 is a section for performing this LOS readout step.

Step S13 (LOS determination processing): The MCU 13 determines whether or not the value of the LOS signal read out by the LOS detection circuit 12*k* is 0. In a case where the value of the LOS signal is 0, the MCU 13 proceeds to step S14 of the offset cancellation processing. However, in a case where the value of the LOS signal is 1, the MCU 13 ends the offset cancellation processing.

Step S14 (threshold voltage change processing): The MCU 13 changes a level of the threshold voltage Vth generated by the variable voltage source 12*b*. The MCU 13 performs this change based on respective values of the reference voltage Vref and an error amplifier output Verr, the respective values both being read out by the voltage readout section 13*a*. After this, the MCU 13 ends the offset cancellation processing. The threshold voltage changing section 13*c* of the MCU 13 illustrated in FIG. 1 is a section for executing this threshold voltage change processing. When Verr>Vref+$\Delta$, the threshold voltage changing section 13*c* sets a value of a variable expressing the threshold voltage Vth to a value greater by $\delta$ than the present value. In contrast, when Verr<Vref−$\Delta$, the threshold voltage changing section 13*c* sets the value of the variable expressing the threshold voltage Vth to be less by $\delta$ than the present value. Here, $\Delta$ is a positive constant, predetermined as a tolerance. The threshold voltage changing section 13*c* further controls the variable voltage source 12*b*, through the I2C interface 13*e*, such that the level of the threshold voltage Vth matches the set value. Note that an explanation of a flow of the threshold voltage change processing is provided later in reference to a different drawing.

The following describes why it is possible to bring the offset voltage Vos closer to 0 [V] via the above offset cancellation processing. In a case where Vos>$\Delta$, (equivalent to: Verr>Vref+$\Delta$), i.e., in a case where the threshold voltage Vth is too low with respect to an average level (an average value of a high level and a low level) of a voltage signal outputted from the transimpedance amplifier 12*a*, the threshold voltage Vth is increased by the threshold voltage change processing. This results in a reduction of a value of the offset voltage Vos. Conversely, in a case where Vos<−$\Delta$, (equivalent to: Verr<Vref−$\Delta$), i.e., in a case where the threshold voltage Vth is too high with respect to the average level of the voltage signal outputted from the transimpedance amplifier 12*a*, the threshold voltage Vth is reduced by the threshold voltage change processing. This results in an increase of the value of the offset voltage Vos. Therefore, repetition of the above offset cancellation processing makes it possible to make an absolute value |Vos| of the offset voltage Vos equal to or less than the tolerance Δ.

However, if the above threshold voltage change processing is repeated in a no-signal section in which a received optical signal continues to be an off-level value, then the level of the threshold voltage Vth will decrease limitlessly. This may greatly distort a waveform of a differential signal immediately after the start of a signal section following a no-signal section. In view of this, the above offset cancellation processing employs a configuration in which the threshold voltage change processing is skipped in a no-signal section. This prevents a waveform of a differential signal from being distorted greatly immediately after the start of a signal section following a no-signal section.

Note that in the above offset cancellation processing, there are two execution modes, each mode having a different speed at which the threshold voltage Vth is changed. Hereinafter, an execution mode in which the threshold voltage Vth is changed at a slower speed, i.e., a second execution mode, is referred to as a "normal control mode." Conversely, an execution mode in which the threshold voltage Vth is changed at a faster speed, i.e., a first execution mode, is referred to as an "accelerated control mode." Either one of the execution modes of the offset cancellation processing is set independently for each channel.

The MCU 13 uses a 1-bit (2-step) binary number as a variable expressing the execution mode of the offset cancellation processing for each channel. Hereinafter, this variable is referred to as an "accelerated control flag ACF". The MCU 13 further uses an 8-bit (256-step) binary number as a variable expressing the threshold voltage Vth. Hereinafter, this variable is referred to as "variable Vth".

When a value of the accelerated control flag ACF is 1, i.e., when the offset cancellation processing is executed in the accelerated control mode, the MCU 13 changes, by 2 steps ($1/128$ of an entire variable range, corresponding to an amount of change δ=0×02), a value of the variable Vth each time step S14 (threshold voltage change processing) is performed. Conversely, when the value of the accelerated control flag ACF is 0, i.e., when the offset cancellation processing is executed in the normal control mode, the MCU 13 changes, by 1 step ($1/256$ of the entire variable range) (by an amount of change δ=0×01), the value of the variable Vth each time step S14 (threshold voltage change processing) is performed.

[Timing of Execution of Offset Cancellation Processing]

Figure 3:
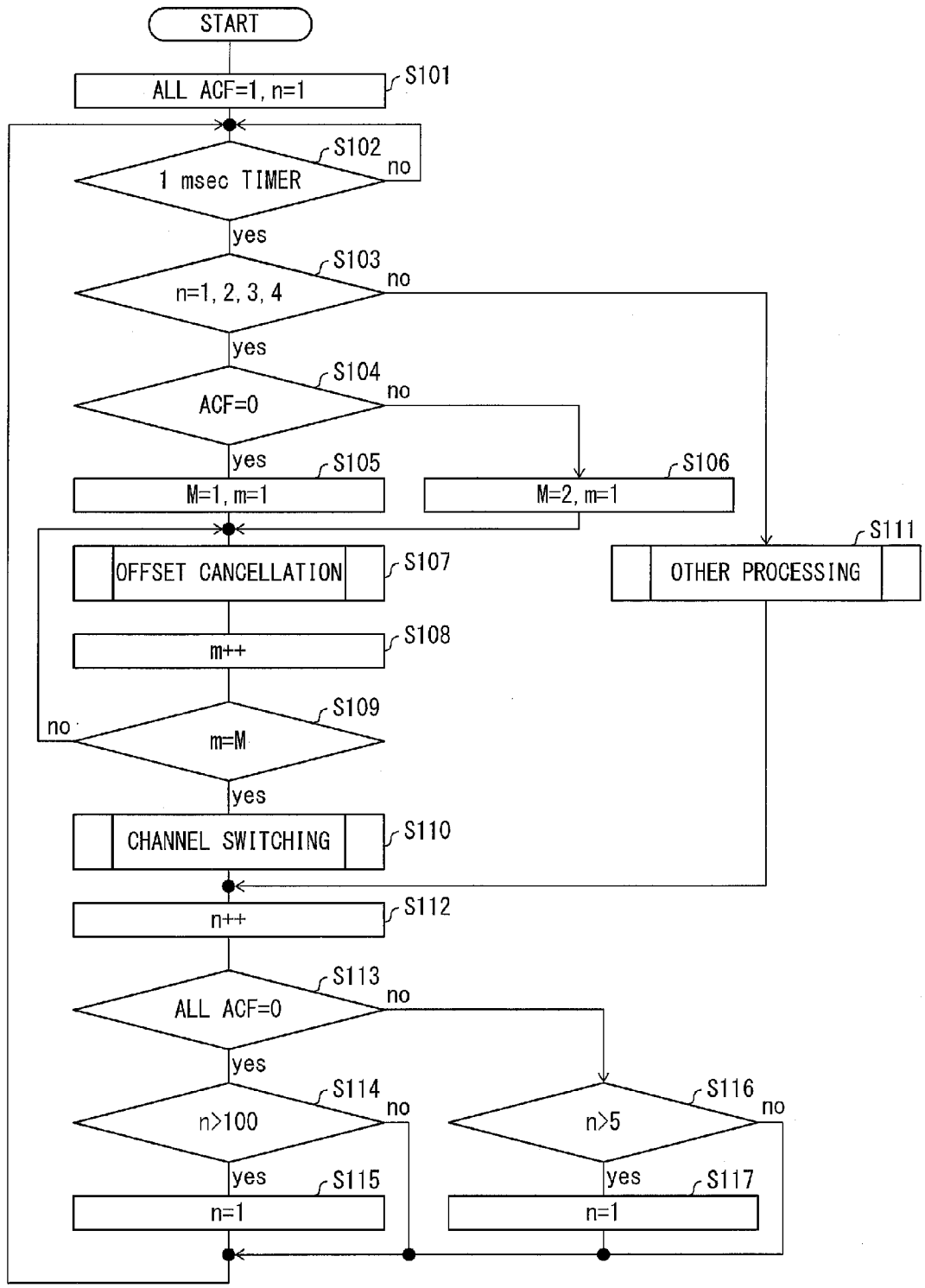
FIG. 3 is a flowchart showing a flow of processing, in its entirety, executed by an MCU of the optical receiver illustrated in FIG. 1.

The MCU 13 determines timing of execution of the offset cancellation processing in accordance with the flowchart of FIG. 3. FIG. 3 is a flowchart showing a flow of processing, in its entirety, executed by the MCU 13. The following describes operation of the MCU 13 during each step of the flowchart of FIG. 3.

Step S101: The MCU 13 initializes the value of the accelerated control flag ACF of every channel to 1. The MCU 13 further initializes a value of a main counter n to 1.

Step S102: The MCU 13 repeatedly determines whether or not a 1 millisecond timer counter has counted up. This is repeated until a result of this determination becomes "yes". Once the result is "yes", the MCU 13 proceeds to step S103.

Step S103: The MCU 13 determines whether or not the value of the main counter is one of the following: 1, 2, 3, and 4. If a result of this determination is "yes", the MCU 13 then proceeds to step S104. If the result is "no", the MCU 13 then proceeds to step S111 instead.

Step S104: The MCU 13 determines whether or not a value of an accelerated control flag ACF of a channel subject to the offset cancellation processing is 0. If a result of this determination is "yes", the MCU 13 then proceeds to step S105. If the result is "no", the MCU 13 then proceeds to step S106 instead.

Step S105: The MCU 13 initializes a value of a sub-counter m to 1. At the same time, the MCU 13 sets an upper limit value M of the value of the sub-counter m to 1. The MCU 13 then proceeds to step S107.

Step S106: The MCU 13 initializes the value of the sub-counter m to 1. At the same time, the MCU 13 sets the upper limit value M of the value of the sub-counter m to 2. The MCU 13 then proceeds to step S107.

Step S107: The MCU 13 executes the offset cancellation processing as shown in FIG. 2. The MCU 13 then proceeds to step S108.

Step S108: The MCU 13 increases, by one increment, the value of the sub-counter m, then proceeds to step S109.

Step S109: The MCU 13 determines whether or not the value of the sub-counter m has reached the upper-limit value. If a result of this determination is "yes", the MCU 13 then proceeds to step S110. If the result is "no", then the MCU 13 returns to step S107 instead.

Step S110: The MCU 13 switches the channel subject to the offset cancellation processing to a next channel. The MCU 13 then proceeds to step S112. Note that if the channel subject to the processing is a channel k (k=1, 2, or 3), then after the above switching, the channel subject to the processing becomes a channel k+1. If the channel subject to the processing is channel 4, then after the above switching, the channel subject to the processing becomes channel 1. The channel switching section 13d of the MCU 13 illustrated in FIG. 1 is a section for executing this channel switching processing. The channel switching section 13d controls the switch 12i through the I2C interface 13e such that a differential signal outputted from the differential amplifier 12e of the channel subject to the offset cancellation processing (i.e., subject to the offset cancellation processing after channel switching) is supplied to the error amplifier 12j.

Step S111: The MCU 13 executes some other processing (optional processing other than the offset cancellation processing), then proceeds to step S112. Note that this step is provided to avoid a situation in which the MCU 13 is dedicated solely to the offset cancellation processing.

Step S112: The MCU 13 increases, by one increment, the value of the main counter n, then proceeds to step S113.

Step S113: The MCU 13 determines whether or not the value of the accelerated control flag ACF of every channel is 0. If a result of this determination is "yes", the MCU 13 then proceeds to step S114. If the result is "no", i.e., if the value of the accelerated control flag ACF of any one of the channels is 1, the MCU 13 then proceeds to step S116.

Steps S114 and S115: The MCU 13 determines whether or not the value of the main counter n is greater than 100. If a result of this determination is "yes", then the MCU 13 resets the value of the main counter n to 1 and returns to step S102.

Steps S116 and S117: The MCU 13 determines whether or not the value of the main counter n is greater than 5. If a result of this determination is "yes", then the MCU 13 resets the value of the main counter n to 1 and returns to step S102.

In a case where the timing of execution of the offset cancellation processing is determined in accordance with the flowchart of FIG. 3, an execution form of the offset cancellation processing becomes any one of Execution Forms 1 through 3 shown in the table below.

TABLE 1

|  | ACF = 1 in channel subject to processing | ACF = 0 in channel subject to processing |
|---|---|---|
| ACF = 1 in any one channel | <Execution Form 1> Amount of change δ: 2 steps Execution frequency: 2 times/5 msec | <Execution Form 2> Amount of change δ: 1 step Execution frequency: 1 time/5 msec |
| ACF = 0 in every channel |  | <Execution Form 3> Amount of change δ: 1 step Execution frequency: 1 time/100 msec |

At the time of commencement of operation (at the time of power-on), the execution mode of the offset cancellation processing is set to be the accelerated control mode for every channel (step S101). Therefore, the execution form of the offset cancellation processing for each channel becomes <Execution Form 1> shown in Table 1.

If the execution mode of the offset cancellation processing for any one of the channels is subsequently switched from the accelerated control mode to the normal control mode ("Yes" in step S104), then the execution form of the offset cancellation processing for that channel transitions from <Execution Form 1> to <Execution Form 2> shown in Table 1. Such a transition from <Execution Form 1> to <Execution Form 2> occurs independently for each channel.

If the execution mode of the offset cancellation processing for every channel is subsequently switched from the accelerated control mode to the normal control mode ("Yes" in step S113), then the execution form of the offset cancellation processing for each channel transitions from <Execution Form 2> to <Execution Form 3> shown in Table 1. The transition from <Execution Form 2> to <Execution Form 3> occurs simultaneously in all the channels. Note that in the present embodiment, a frequency of execution of the threshold value change processing in <Execution Form 3> is once per 100 milliseconds, but the frequency is not limited to this. For example, the frequency of execution of the threshold value change processing in <Execution Form 3> may alternatively be once per 5 seconds. In such a case, in the abovementioned step S114, the MCU 13 determines whether or not the value of the main counter n is greater than 5,000.

Figure 4:
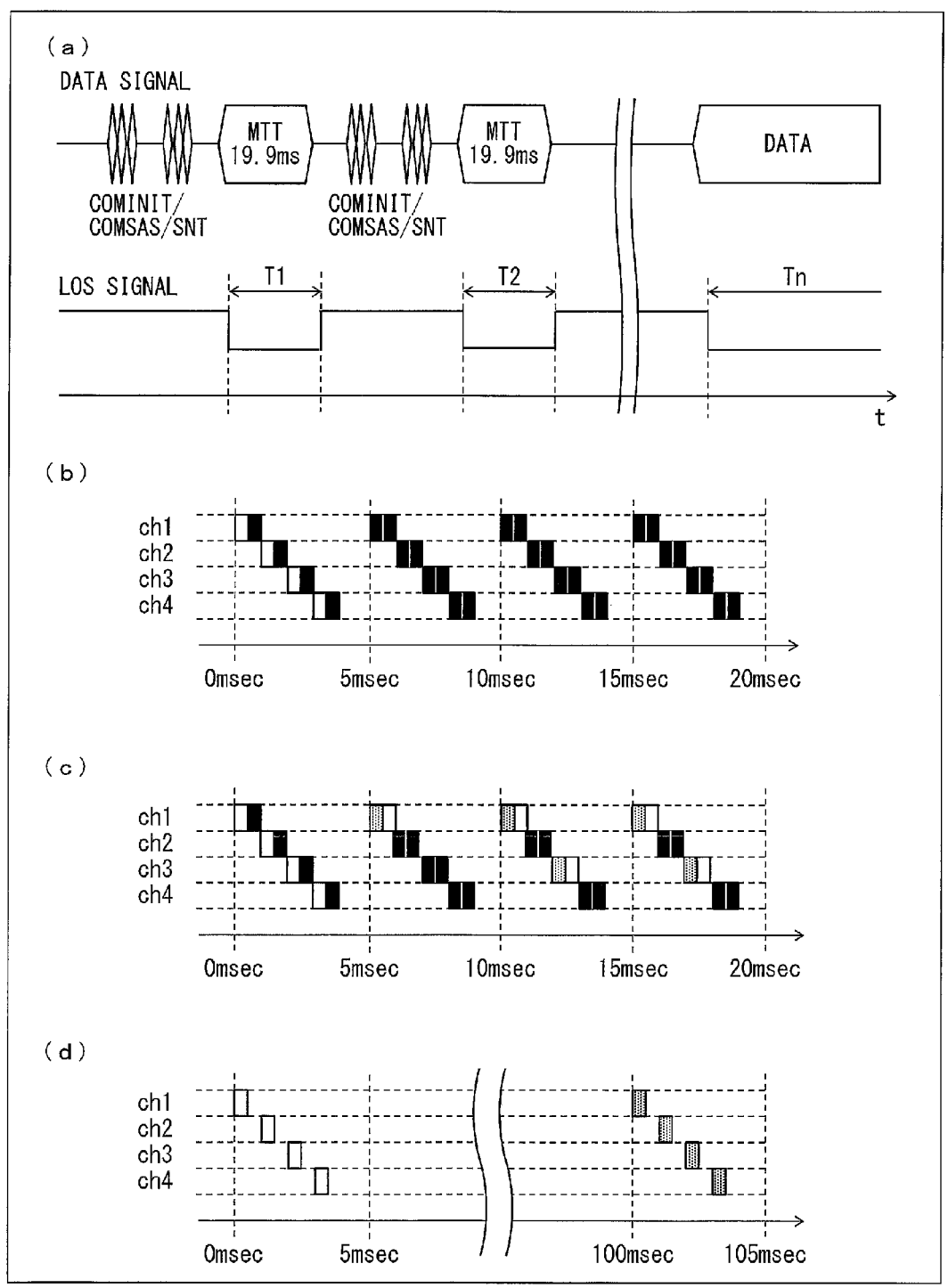
FIG. 4 shows one example of an operation of the MCU, which operation is realized by determining the timing of execution of the offset cancellation processing in accordance with the flowchart shown in FIG. 3.

One example of operation of the MCU 13 is shown in FIG. 4. This operation is realized by determining the timing of execution of the offset cancellation processing in accordance with the flowchart of FIG. 3. (a) of FIG. 4 is a waveform chart depicting respective waveforms of an optical signal and of an LOS signal. (b) of FIG. 4 shows an example of operation of the MCU 13 in section T1 shown in (a) of FIG. 4. (c) of FIG. 4 shows an example of operation of the MCU 13 in section T2 shown in (a) of FIG. 4. (d) of FIG. 4 shows an example of operation of the MCU 13 in section Tn shown in (a) of FIG. 4.

In communications in conformance with SAS 2.0, after power-on, a link-up sequence involving sending and receiving of a COMINIT signal, a COMSAS signal, an SNT (Speed Negotiation Transmit) signal, and an MTT (Maximum Transmitter Training) signal is repeated as shown in (a) of FIG. 4, for example, five times at the maximum. Here, the COMINIT signal, the COMSAS signal, and the SNT signal are each an OOB signal in which a DATA section and an IDLE section appear alternately (i.e., are each an example of a "first optical signal" recited in the claims below). Each of these OOB signals has significance as a signal not in terms of a bit pattern of the DATA section, but rather in terms of a width (duration) of the DATA section and the IDLE section. For example, the COMSAS signal is specified as being an OOB signal having a DATA section of 106 nanoseconds and an IDLE section of 960 nanoseconds, the DATA section and the IDLE section appearing alternately. The optical receiver 1 can therefore correctly recognize these OOB signals regardless of whether offset cancellation has been completed or not. Conversely, the MTT signal (an example of a "second optical signal" recited in the claims below) is a data signal whose DATA section has a duration of 19.9 milliseconds. The MTT signal has significance as a signal not in terms of a width of the DATA section, but rather in terms of a bit pattern of the DATA section. Due to this fact, in order for the optical receiver 1 to correctly recognize an MTT signal, it is necessary to (i) complete the offset cancellation processing before receiving the MTT signal and (ii) accurately read the value of each component bit of the MTT signal. As shown in (a) of FIG. 4, an LOS signal read out by the MCU 13 has a value of 0 in sections T1, T2, etc. (sections in which the MTT signal is received), as well as in sections Tn (sections in which some other data signal is received). The threshold voltage change processing is executed for such sections in which the LOS signal has a value of 0.

The MCU 13 reads out the LOS signal at a cycle which is set to be (i) longer than a DATA section of an OOB signal (the COMINIT signal, the COMSAS signal, or the SNT signal; in the case of the COMSAS signal, the DATA section lasts 106 nanoseconds) and (ii) shorter than the DATA section (19.9 milliseconds) of the MTT signal. Thus, during reception of the OOB signal, readout of the LOS signal is performed once at most. During reception of the MTT signal, readout of the LOS signal is performed at least twice (four times in the present embodiment). Note that as shown in (a) of FIG. 4, in the DATA section of (i) the COMINIT signal, (ii) the COMSAS signal, and (iii) the SNT signal, the value of the LOS signal read out by the MCU 13 is not 0. This is because the readout, by the MCU 13, of the value of the LOS signal is performed through the clear-on-read register. This means that the threshold voltage change processing is not performed for respective DATA sections of (i) a COMINIT signal, (ii) a COMSAS signal, and (iii) an SNT signal. Thus, even if the mark rate of a COMINIT signal, a COMSAS signal or an SNT signal is not 50%, the variable Vth will not be set to an incorrect value in a section in which one of the above signals is received. Note that if the mark rate of a COMINIT signal, a COMSAS signal, or an SNT signal is 50%, the threshold voltage change processing may be performed for sections in which one of the above signals is received. In such a case, it is not necessary to perform readout of the value of the LOS signal through the clear-on-read register.

(b) through (d) of FIG. 4 show timing of execution of the offset cancellation processing for each channel. In each of (b) through (d) of FIG. 4, the timing is indicated by placing, along an axis representing time, rectangles representing periods of execution of the offset cancellation processing. In (b) through (d) of FIG. 4, the offset cancellation processing represented by white rectangles is unaccompanied by the threshold voltage change processing; the offset cancellation processing represented by grey (dotted) rectangles is accompanied by the threshold voltage change processing in which the value of the variable Vth is changed by 1 step (0×01); and the offset cancellation processing represented by black rectangles is accompanied by the threshold voltage change processing in which the value of the variable Vth is changed by 2 steps (0×02).

(b) of FIG. 4 shows a typical example of operation of the MCU 13 during a period of time in which the offset cancellation processing is executed in the accelerated control mode for every channel. In an example shown in (b) of FIG. 4, for every channel, the offset cancellation processing is executed twice per 5 milliseconds, the offset cancellation processing being accompanied by the threshold voltage change processing in which the value of the variable Vth is changed by 2 steps ("Execution Form 1" in Table 1). Note, however, that the offset cancellation processing immediately after fall of the LOS signal is not accompanied by the threshold voltage change processing. This is because readout of the LOS signal is performed through the clear-on-read register. This makes it possible, in section Ti in which the optical receiver 1 receives an MTT signal, for the MCU 13 to (i) execute the threshold voltage change processing 7 times at the maximum for each channel, and (ii) change the value of the variable Vth by a maximum of 14 steps (0×0e) for each channel.

Thereafter, the MCU 13 switches the execution mode of the offset cancellation processing from the accelerated control mode to the normal control mode. The order in which this switching is performed for the channels follows the order in which offset cancellation is performed (the order in which the absolute value |Vos| of the offset voltage Vos becomes equal to or less than the tolerance Δ). (c) of FIG. 4 shows a typical example of operation of the MCU 13 during a period in which there is a mix of (i) a channel(s) for which the offset cancellation processing is being executed in the accelerated control mode and (ii) a channel(s) for which the offset cancellation processing is being executed in the normal control mode. In the example shown in (c) of FIG. 4, for both channel 2 and channel 4, the offset cancellation processing is executed twice per 5 milliseconds, the offset cancellation processing being accompanied by the threshold voltage change processing in which the value of the variable Vth is changed by 2 steps ("Execution Form 1" in Table 1). With regards to channel 1, for the period of time from 0 milliseconds after starting to milliseconds after starting, the offset cancellation processing is performed twice per 5 milliseconds, the offset cancellation processing being accompanied by the threshold voltage change processing in which the value of the variable Vth is changed by 2 steps ("Execution Form 1" in Table 1). Further, for channel 1, for the period of time from 5 milliseconds after starting to 20 milliseconds after starting, the offset cancellation processing is executed once per 5 milliseconds, the offset cancellation processing being accompanied by the threshold voltage change processing in which the value of the variable Vth is changed by 1 step ("Execution Form 2" in Table 1). With regards to channel 3, for the period of time from 0 milliseconds after starting to 10 milliseconds after starting, the offset cancellation processing is performed twice per 5 milliseconds, the offset cancellation processing being accompanied by the threshold voltage change processing in which the value of the variable Vth is changed by 2 steps ("Execution Form 1" in Table 1). Further, for channel 3, for the period of time from 10 milliseconds after starting to 20 milliseconds after starting, the offset cancellation processing is performed once per 5 milliseconds, the offset cancellation processing being accompanied by the threshold voltage change processing in which the variable Vth is changed by 1 step ("Execution Form 2" in Table 1). Note that (c) of FIG. 4 depicts a state immediately after the LOS signal has fallen and that the first offset cancellation processing executed is not accompanied by the threshold voltage change processing.

(d) of FIG. 4 shows a typical example of operation of the MCU 13 during a period of time in which the offset cancellation processing is executed in the normal control mode for every channel. In the example shown in (d) of FIG. 4, for every channel, the offset cancellation processing is executed once per 100 milliseconds, the offset cancellation processing being accompanied by the threshold voltage change processing in which the value of the variable Vth is changed by 1 step ("Execution Form 3" in Table 1). Note that (d) of FIG. 4 depicts a state immediately after fall of the LOS signal. In this state, the first offset cancellation processing performed is not accompanied by the threshold voltage change processing.

Thus, the MCU 13 can change the value of the variable Vth by a maximum of 14 steps (0×0e) in the section Ti in which the optical receiver 1 receives an MTT signal. Thus, in sections T1 through T4, in which the optical receiver 1 receives respective first through fourth MTT signals, the MCU 13 can change the value of the variable Vth by a maximum of 56 (=14×4) steps. In a case where an optical transmitter includes a light emitting element that is a VCSEL, a VCSEL temperature change causes fluctuation in received power. This power fluctuation causes offset. An amount of change in variable Vth required to cancel this offset (i.e., to bring the absolute value |Vos| of the offset voltage Vos equal to or less than the tolerance Δ) is 56 steps or fewer. The reason for this is explained later. This makes it possible for the MCU 13 to reliably complete cancellation of the offset in sections T1 through T4, in which the optical receiver 1 receives the first through fourth MTT signals, respectively. This in turn allows the MCU 13 to correctly read the bit pattern of at least a fifth MTT signal and establish a link before five link-up sequences end.

[Amount of Change in Variable Vth Required to Cancel Offset]

In a case where an optical transmitter includes a light emitting element that is a VCSEL, a VCSEL temperature change causes fluctuation in received power. This power fluctuation causes offset. An amount of change in variable Vth required to cancel this offset (i.e., to bring the absolute value |Vos| of the offset voltage Vos equal to or less than the tolerance Δ) is, as mentioned above, 56 steps or fewer. The following discusses this in more detail with reference to FIG. 5.

Firstly, in a case where VCSEL deterioration over time (explained later) is not considered, a range of fluctuation of the power of an optical signal received by the optical receiver 1 (this power is hereinafter referred to as "received power") is, for example, −2.3 dBm/+2.6 dBm. The variable Vth has an initial value which is determined such that offset for any given received power within the above range of fluctuation is cancelled. The maximum value that the variable Vth can take on as the initial value is determined such that offset for a received power of +2.6 dBm is cancelled. Likewise, the minimum value that the variable Vth can take on as the initial value is determined such that offset for a received power of −2.3 dBm is cancelled.

Figure 5:
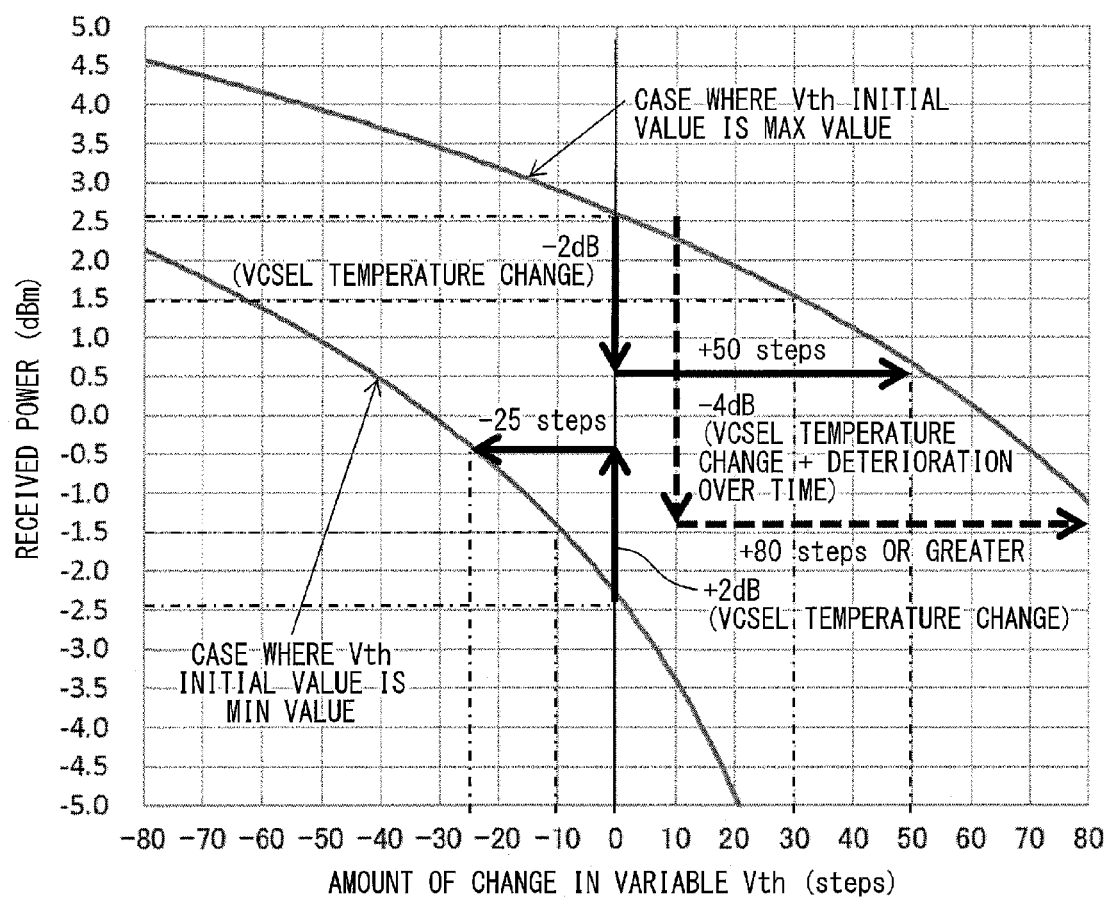
FIG. 5 is a graph showing the relationship between (i) received power (dBm) and (ii) the amount of change in variable Vth (in steps) necessary to cancel offset for the received power. This graph shows cases where an initial value of the variable Vth is set to a maximum value and a minimum value, respectively.

FIG. 5 is a graph obtained by confirming, via experiment, the relationship between (i) received power (in dBm) and (ii) the amount of change in variable Vth (in steps) necessary to cancel offset for the received power. This graph shows cases where the initial value of the variable Vth is set to a maximum value and a minimum value, respectively. The graph of FIG. 5 shows, for example, that if the received power is +1.5 dBm in a case where the initial value of the variable Vth is set to be a maximum value, offset can be cancelled by increasing the value of the variable Vth by 30 steps. The graph of FIG. 5 also shows, for example, that alternatively, if the actual received power is −1.5 dBm in a case where the initial value of the variable Vth is set to be a minimum value, offset can be cancelled by reducing the value of the variable Vth by 10 steps.

The fluctuation in received power caused by the VCSEL temperature change is in a range of 2.0 dB (−1.5 dB/+0.5 dB). The amount of change in variable Vth required to cancel offset caused by such fluctuation in received power is 56 steps or fewer. In actuality, as shown in FIG. 5, in a case where the initial value of the variable Vth is set to be a maximum value, the received power may decrease, due to the VCSEL temperature change, to as low as +0.6 dBm (=+2.6 dBm−2.0 dBm). However, offset occurring in such a case can be cancelled by increasing the value of the variable Vth by 50 steps. As shown in FIG. 5, in a case where the initial value of the variable Vth is set to be a minimum value, the received power may increase, due to the VCSEL temperature change, to as high as −0.3 (=−2.3+2.0) dBm. However, offset occurring in such a case can be cancelled by decreasing the value of the variable Vth by 25 steps.

In the present embodiment, the amount of change in variable Vth during the offset cancellation processing, in Execution Form 1, is 2 steps. It should be noted that this amount of change is set in response to the fact that the maximum amount of change in variable Vth required to cancel the offset due to the VCSEL temperature change is 50 steps. The reason for this is as follows. In a case where the amount of change in variable Vth during the offset cancellation processing is set to be 1 step instead in the above-mentioned Execution Form 1, the maximum amount of change in variable Vth in sections T1 through T4, i.e., in sections in which the optical receiver 1 receives the first through fourth MTT signals, respectively, is 28 (=7×4) steps. This amount is less than 50 steps, which is the amount of change in Vth required to cancel the offset due to the VCSEL temperature change.

[Nonvolatile Storage of Value of Variable Vth]

The power of an optical signal received by the optical receiver 1 (this power is hereinafter referred to as "received power") fluctuates due to VCSEL temperature change and VCSEL deterioration over time, the VCSEL being provided as a light emitting element of an optical transmitter. The range of fluctuation in received power due to the VCSEL temperature change is, as mentioned above, approximately −1.5 dB/+0.5 dB, whereas a range of fluctuation in received power due to the VCSEL deterioration over time is approximately −2 dB/+0 dB.

In the optical receiver 1 according to the present embodiment, it is possible to change the value of the variable Vth by a maximum of 56 steps by the time when a final MTT signal is received, the variable Vth being represented by an 8-bit binary number. Therefore, even if the VCSEL temperature change causes the received power to fluctuate in a range of approximately 2.0 dB (−1.5 dB/+0.5 dB), it is possible to reliably cancel offset before receiving an MTT signal in a final link-up sequence unless the received power fluctuates due to the VCSEL deterioration over time.

However, in a case where the fluctuation in received power due to temperature change of the light emitting element coincides with fluctuation in received power due to deterioration over time of the light emitting element, a range of resulting fluctuation in received power becomes −3.5 dB/+0.5 dB (a fluctuation over a range of 4 dB). The amount of change in variable Vth required to cancel offset produced by such a fluctuation in received power is more than 56 steps. In actuality, as shown in FIG. 5, in a case where the initial value of Vth is set to a maximum value, the amount of change in variable Vth required to cancel offset is 80 steps or more. Therefore, if the initial value of the variable Vth is fixed to be a value set at the time of shipment from factory, then it becomes impossible to cancel offset before reception of the MTT signal in the final link-up sequence.

In order to address this issue, the optical receiver 1 includes a configuration in which (i) at the time when operation ends, the value of the variable Vth at that point is written to the nonvolatile memory 14 and (ii) the value of the variable Vth read out from the nonvolatile memory 14 at the time when operation commences is used as the initial value in the offset cancellation processing. With this configuration, even if (i) fluctuation in received power due to temperature change of the light emitting element coincides with fluctuation in received power due to deterioration over time of the light emitting element, and (ii) the received power fluctuates in a range of approximately −3.5 dB/+0.5 dB, it is possible to reduce the amount of change in variable Vth (the amount of change from the initial value) required to cancel offset to approximately −1.5 dB/+0.5 dB (the range of the fluctuation in received power due to the temperature change). Thus, it is possible to ensure that offset is cancelled before reception of the MTT signal in the final link-up sequence. In other words, the optical receiver 1 avoids problems such as (i) uncompleted offset cancellation at the end of the fourth link-up sequence or (ii) reduced precision of offset cancellation. Note that even if deterioration over time of the light emitting element occurs during operation of the optical receiver 1, the variable Vth changes while the offset cancellation processing is being executed. In this case, the variable Vth changes by following gradual fluctuation in received power that accompanies the deterioration over time of the light emitting element. Therefore, no problems will occur even if deterioration over time of the light emitting element occurs during operation of the optical receiver 1.

Note that although the present embodiment includes a configuration in which the threshold voltage write processing (processing in which the value of the variable Vth is written to the nonvolatile memory 14) is executed at the time when operation of the MCU 13 ends, the present embodiment is not limited to this configuration. For example, in an alternative configuration, the threshold voltage write processing may be performed periodically during operation of the MCU 13. Employing such a configuration would eliminate the need to provide the voltage holding circuit as described above.

Note that if an execution cycle of the threshold voltage write processing is lengthened, the nonvolatile memory 14 has a longer life, but the variable Vth in nonvolatile storage will be less accurate as an initial value. This loss of accuracy is caused by an increase in length of time between (i) when the MCU 13 last performs the threshold voltage write processing and (ii) when operation of the MCU 13 ends. In contrast, if the execution cycle of the threshold voltage write processing is shortened, the nonvolatile memory 14 has a shorter life, but the variable Vth in nonvolatile storage becomes more accurate as an initial value. This increase in accuracy is caused by a decrease in length of time between (i) when the MCU 13 last performs threshold voltage write processing and (ii) when operation of the MCU 13 ends. In view of both the life of the nonvolatile memory 14 and the accuracy of the variable Vth in nonvolatile storage as an initial value, it is preferable that the execution cycle of the threshold voltage write processing be not less than 30 minutes and not more than 1 hour and 30 minutes. It is more preferable that the execution cycle of the threshold voltage write processing be 1 hour.

[Threshold Voltage Change Processing]

Figure 6:
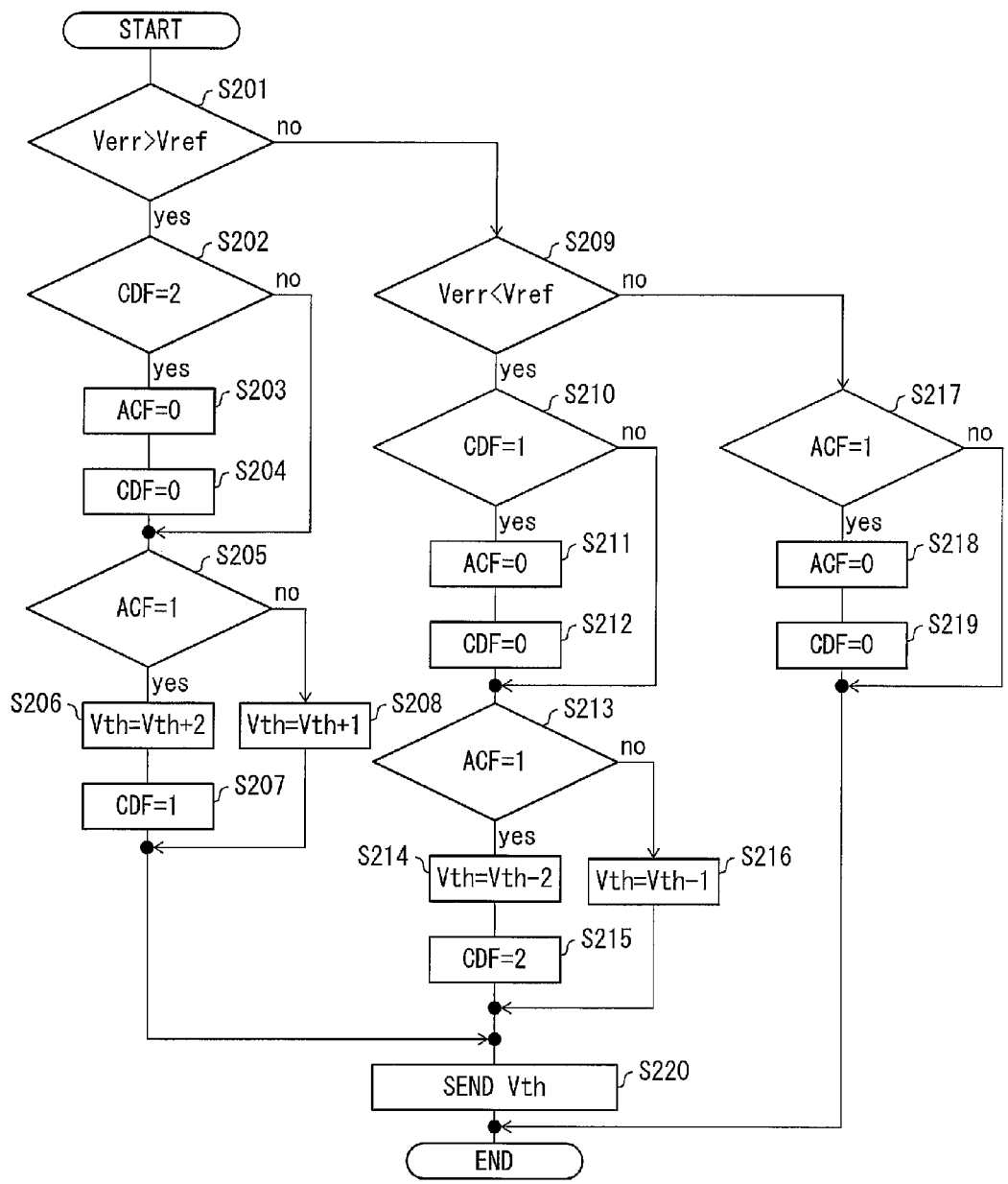
FIG. 6 is a flowchart showing a flow of threshold voltage change processing executed by an MCU of the optical receiver illustrated in FIG. 1.

The MCU 13 executes threshold voltage change processing in accordance with the flowchart of FIG. 6. FIG. 6 is a flowchart showing a flow of threshold voltage change processing. The following describes operation of the MCU 13 during each step of the flowchart of FIG. 6.

Note that this threshold voltage change processing makes use of a control direction flag CDF in addition to the accelerated control flag ACF. The control direction flag CDF is a flag which takes on one of 3 possible values. The control direction flag CDF takes on a value of 1 in the case of accelerated control whose direction is a direction that increases the value of the variable Vth. The control direction flag CDF takes on a value of 2 in the case of accelerated control whose direction is a direction that decreases the value of the variable Vth. The control direction flag CDF takes on an initial value of 0 when (i) accelerated control changes in direction, or (ii) an error amplifier output Verr is within a range equaling a reference voltage Vref±a tolerance Δ.

Step S201: The MCU 13 determines whether or not the error amplifier output Verr has a value greater than a value of the sum of (i) a value of the reference voltage Vref and (ii) the tolerance Δ. If a result of this determination result is "yes", the MCU 13 then proceeds to step S202. If the result is "no", the MCU 13 then proceeds to step S209.

Step S202: The MCU 13 determines whether or not the control direction flag CDF has a value of "2". If a result of this determination is "yes", the MCU 13 then proceeds to step S203. If the result is "no", the MCU 13 then proceeds to step S205.

Step S203: The MCU 13 sets the value of the accelerated control flag ACF to 0, and then proceeds to step S204.

Step S204: The MCU 13 sets the value of the control direction flag CDF to 0, and then proceeds to step S205.

Step S205: The MCU 13 determines whether or not the value of the accelerated control flag ACF is 1. If a result of this determination is "yes", the MCU 13 then proceeds to step S206. If the result is "no", the MCU 13 then proceeds to step S208.

Step S206: The MCU 13 increases the value of variable Vth by 2 steps (0×02), and then proceeds to step S207.

Step S207: The MCU 13 sets the value of the control direction flag CDF to 1, and then proceeds to step S220.

Step S208: The MCU 13 increases the value of variable Vth by 1 step (0×01), and then proceeds to step S220.

Step S209: The MCU 13 determines whether or not the error amplifier output Verr has a value less than a value obtained by subtracting the tolerance Δ from the value of the reference voltage Vref. If a result of this determination is "yes", the MCU 13 then proceeds to step S210. If the result is "no", the MCU 13 then proceeds to step S217.

Step S210: The MCU 13 determines whether or not the control direction flag CDF has a value of 1. If a result of this determination is "yes", the MCU 13 then proceeds to step S211. If the result is "no", the MCU 13 then proceeds to step S213.

Step S211: The MCU 13 sets the value of the accelerated control flag ACF to 0, and then proceeds to step S212.

Step S212: The MCU 13 sets the value of the control direction flag CDF to 0, and then proceeds to step S213.

Step S213: The MCU 13 determines whether or not the value of the accelerated control flag ACF is 1. If a result of this determination is "yes", the MCU 13 then proceeds to step S214. If the result is "no", the MCU 13 then proceeds to step S216.

Step S214: The MCU 13 decreases the value of the variable Vth by 2 steps (0×02), and then proceeds to step S215.

Step S215: The MCU 13 sets the value of the control direction flag CDF to 2, and then proceeds to step S220.

Step S216: The MCU 13 decreases the value of variable Vth by 1 step (0×01), and then proceeds to step S220.

Step S217: The MCU 13 determines whether or not the value of the accelerated control flag ACF is 1. If a result of this determination is "yes", the MCU 13 proceeds to step S218. If the result is "no", the MCU 13 ends the threshold voltage change processing.

Step S218: The MCU 13 sets the value of the accelerated control flag ACF to 0, and then proceeds to step S219.

Step S219: The MCU 13 sets the value of the control direction flag CDF to 0, and then ends the threshold voltage change processing.

Step S220: The MCU 13 controls the variable voltage source 12b such that a level of the threshold voltage Vth matches the value of the variable Vth obtained in step S206, S208, S214, or S216.

Figure 7:
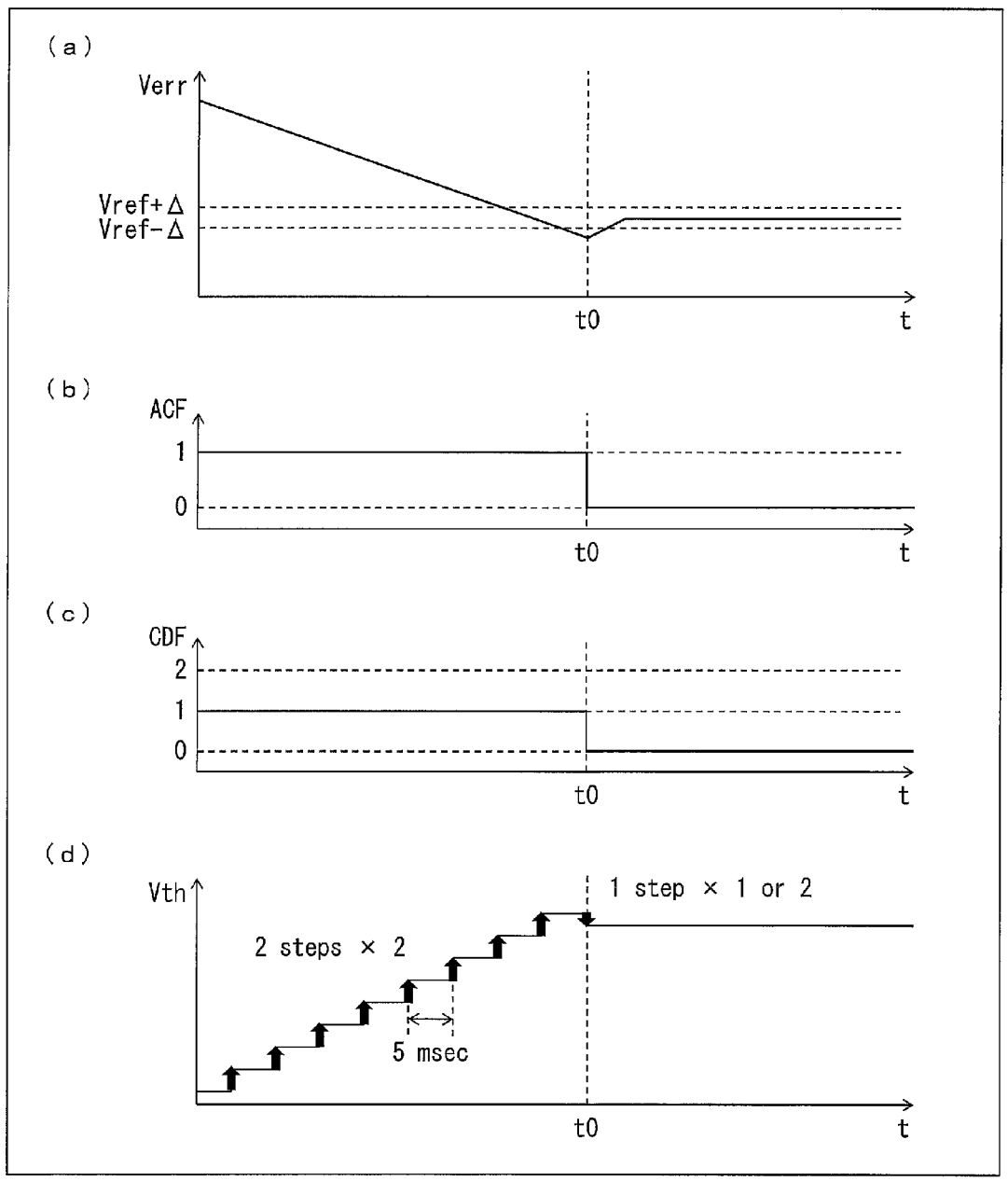
FIG. 7 shows one example of an operation of an MCU, which operation is realized by executing threshold voltage change processing in accordance with the flowchart shown in FIG. 6.

FIG. 7 shows an example of operation of the MCU 13, the operation being realized by execution of the threshold voltage change processing in accordance with the flowchart of FIG. 6. The initial state of this example of operation is as follows: Verr>Vref+Δ; accelerated control flag ACF=1; and control direction flag CDF=1.

(a) of FIG. 7 is a graph showing a change in amount of the error amplifier output Verr over time. (b) of FIG. 7 is a graph showing a change in the value of the accelerated control flag ACF over time. (c) of FIG. 7 is a graph showing a change over time of the control direction flag CDF. (d) of FIG. 7 is a graph showing a change in level of the threshold voltage Vth over time.

In a case where Verr>Vref+Δ ("Yes" in step S201); the control direction flag CDF=1 ("No" in step S202); and the accelerated control flag ACF=1 ("Yes" in step S205), offset cancellation processing A is executed repeatedly at a frequency of twice per 5 milliseconds. In the above case, the offset cancellation processing A is accompanied only by processing in which the value of the variable Vth is increased by 2 steps (step S208). Through this processing, the level of the threshold voltage Vth gradually increases as shown in (d) of FIG. 7, and, as a result, the level of the error amplifier output Verr gradually decreases as shown in (a) of FIG. 7.

In a case where repeated execution of the offset cancellation processing A causes the error amplifier output Verr to be less than Vref−Δ ("No" in step S201 and "Yes" in step S209), i.e., in a case where repeated execution of the offset cancellation processing A causes sign inversion of the offset voltage Vos, the following are each executed: (i) processing in which respective values of the accelerated control flag ACF and the control direction flag CDF are both changed to 0 ("Yes" in step S210; and steps S211 and S212); and (ii) one or two times of offset cancellation processing B. Here, "offset cancellation processing B" refers to offset cancellation that is accompanied by processing in which the value of the variable Vth is decreased by 1 step ("No" in step S213; and step S216). In a case where the level of the error amplifier output Verr is not within the range equaling Vref±Δ, the offset cancellation processing B is executed twice. In a case where the level of the error amplifier output Verr is within the range equaling Vref±Δ, the offset cancellation processing B is executed once. Such processing slightly decreases the level of the threshold voltage Vth as shown in (d) of FIG. 7, and, as a result, slightly increases the level of the error amplifier output Verr as shown in (a) of FIG. 7.

In a case where the level of the error amplifier output Verr is within the range equaling Vref±Δ as a result of execution of the offset cancellation processing B ("No" in step S201; "No" in step S209; and "No" in step S217), the threshold voltage Vth is not changed. This causes the level of the threshold voltage Vth to be kept constant as shown in (d) of FIG. 7, and, as a result, the level of the error amplifier output Verr is kept constant as shown in (a) of FIG. 7.

[Active Optical Cable]

The optical receiver 1 according to the present embodiment can be used as a connector of an active optical cable.

Figure 8:
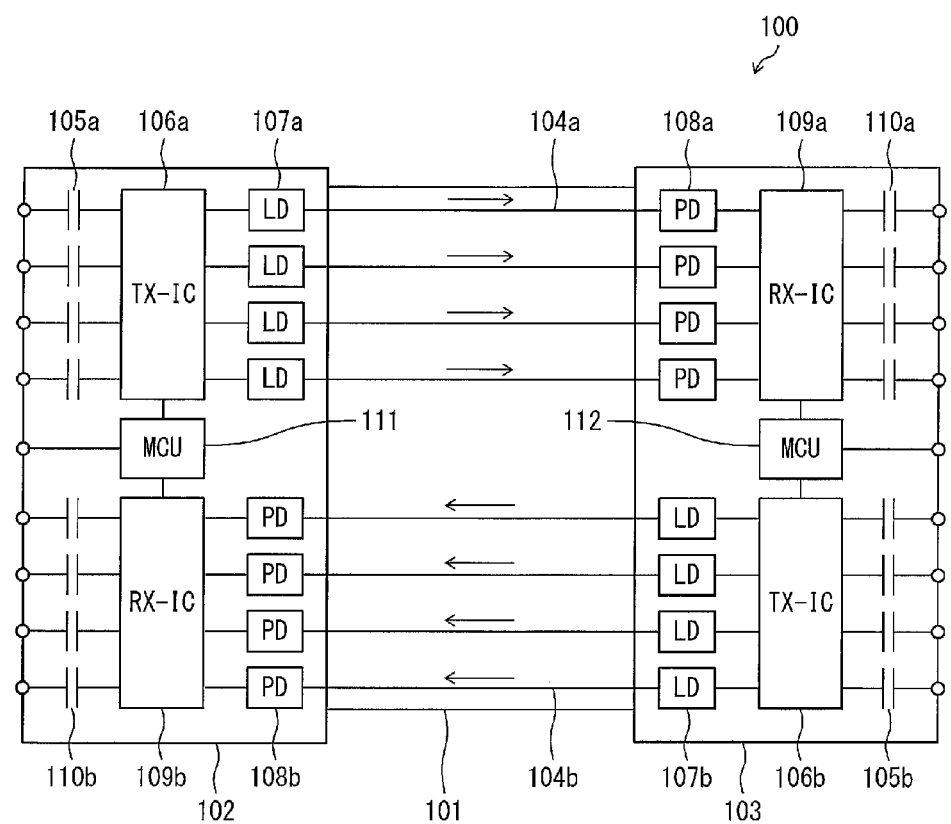
FIG. 8 is a block diagram illustrating an active optical cable that is provided with the optical receiver illustrated in FIG. 1.

FIG. 8 is a block diagram illustrating a configuration of an active optical cable 100. As shown in FIG. 8, the active optical cable 100 includes an optical cable 101 and a pair of connectors 102 and 103, each connector being respectively provided on both ends of the optical cable 101. The optical cable 101 contains eight optical fibers 104a and 104b.

The connector 102 includes four AC coupling condensers 105a, a transmission circuit 106a, and four laser diodes (LDs) 107a. These components of the connector 102 function as an optical transmitter that (i) converts, into an optical signal, a voltage signal externally supplied, and (ii) transmits the optical signal. The connector 102 further includes four photodiodes (PDs) 108b, a receiving circuit 109b, and four AC coupling condensers 110b. These components of the connector 102 function as an optical receiver that (i) converts a received optical signal into a voltage signal and (ii) outputs, outside the connector 102, the voltage signal.

The optical receiver 1 according to the present embodiment is made up of the PDs 108b and the receiving circuit 109b, along with an MCU 111 included in the connecter 102. Therefore, even if there are fluctuations in power of an optical signal sent from the connector 103, it is possible to (i) bring closer to 0 [V] an offset voltage of a differential signal amplified by the receiving circuit 109b and (ii) keep the difference between the offset voltage and 0 [V] (a deviation of the offset voltage from 0 [V]) equal to or less than a predetermined tolerance. Furthermore, the threshold voltage change processing accordingly required is skipped in a no-signal section, in which the value of an optical signal sent from the connector 103 is an off level. This means that a waveform of the voltage signal outputted from the connector 102 will not be distorted immediately after the start of a signal section following a no-signal section.

The connector 103 includes four photodiodes (PDs) 108a, a receiving circuit 109a, and four AC coupling condensers 110a. These components of the connector 103 function as an optical receiver that (i) converts a received optical signal into a voltage signal and (ii) outputs the voltage signal to an external device. The connector 103 further includes four AC coupling condensers 105b, a transmission circuit 106b, and four laser diodes (LDs) 107b. These components of the connector 103 function as an optical transmitter that (i) converts, into an optical signal, a voltage signal externally supplied and (ii) transmits the optical signal.

The optical receiver 1 according to the present embodiment is made up of the PDs 108a and the receiving circuit 109a, along with an MCU 112 provided in the connecter 103. Therefore, even if there are fluctuations in the power of an optical signal sent from the connector 102, it is possible to (i) bring closer to 0 [V] an offset voltage of a differential signal amplified by the receiving circuit 109a and (ii) keep the difference between the offset voltage and 0 [V] (a deviation of the offset voltage from 0 [V]) equal to or less than a predetermined tolerance. Furthermore, the threshold voltage change processing accordingly required is skipped in a no-signal section, in which the value of an optical signal sent from the connector 102 is an off level. This means that a waveform of the voltage signal outputted from the connector 103 will not be distorted immediately after the start of a signal section following a no-signal section.

Thus, in the active optical cable 100, in a case where the connector 103 transmits, to the connector 102, an optical signal having a signal section that follows a no-signal section, a waveform of a voltage signal outputted from the connector 102 will not be distorted immediately after the start of the signal section. Similarly, in a case where the connector 102 transmits, to the connector 103, an optical signal having a signal section that follows a no-signal section, a waveform of a voltage signal output from the connector 103 will not be distorted immediately after the start of the signal section. Therefore, the active optical cable 100 can be used suitably in serial communications in conformance with standards in which it is necessary, in a link-up sequence, to send and receive an OOB signal, a signal including an EI section, and the like. Examples of such standards encompass SAS 2.0 and PCIe 3.0.

In the active optical cable 100, an optical signal received by an optical receiver (for example, PDs 108a and receiving circuit 109a) is an optical signal that is transmitted from a predetermined optical transmitter (for example, the transmission circuit 106a and LDs 107a) through a predetermined optical fiber (for example, optical fibers 104a). It is therefore possible to estimate, in advance, a range of fluctuation of received power of the optical receiver. The estimate is made based on temperature characteristics of light emitting elements (for example, LDs 107a) that are components of the optical receiver. Because of this fact, in the active optical cable 100, it easy to realize offset cancellation processing that uses a predetermined program.

It should be noted, however, that a range of applicability of the present invention is not limited to an active optical cable. The present invention can be applied in a light transceiver module, for example. In a light transceiver module having a wide range of fluctuations (link budget) of received power, it is possible to increase the amount of change δ of the variable which expresses the threshold voltage Vth in the accelerated control mode, such that the amount of change δ is greater than that of the above embodiment. It is also possible to increase the execution frequency of the offset cancellation processing so that the execution frequency will be greater than that of the above embodiment.

[Overview]

An optical receiver according to the present embodiment includes: a photodetector element that converts an optical signal into an electric current signal; a transimpedance amplifier that converts the electric current signal into a voltage signal; a differential amplifier that converts the voltage signal into a differential signal, by performing differential amplification of a difference between the voltage signal and a threshold voltage; a no-signal detection circuit that detects a no-signal section of the optical signal; and a control section that repeatedly executes offset cancellation processing, the offset cancellation processing including threshold voltage change processing in which the threshold voltage is changed such that an offset voltage of the differential signal is reduced, the control section skipping the threshold voltage change processing in the no-signal section.

In other words, an optical receiver according to the present embodiment is an optical receiver including: a photodetector element that converts an optical signal into an electric current signal; a transimpedance amplifier that converts the electric current signal into a voltage signal; a differential amplifier that converts the voltage signal into a differential signal, by differential amplification of a difference between the voltage signal and a threshold voltage; a no-signal detection circuit that detects a no-signal section of the optical signal; and a control section that repeatedly executes offset cancellation processing, the offset cancellation processing, when being performed outside the above no-signal section, including threshold voltage change processing in which the threshold voltage is changed such that an offset voltage of the differential signal is reduced, and the offset cancellation processing, when being performed in the no-signal section, not including the threshold voltage change processing.

The above configuration makes it possible to cancel offset of the differential signal while causing no distortion of a waveform of a voltage signal immediately after the start of a signal section that follows a no-signal section.

It is preferable that the optical receiver according to the present embodiment further include a variable voltage source that generates the threshold voltage, the control section changing the threshold voltage by controlling the variable voltage source.

This configuration makes it possible to realize the control section by using an electronic computer such as an MCU (Micro Controller Unit).

It is preferable that in the optical receiver according to the present embodiment, the offset cancellation processing has two execution modes which are different from each other in an amount of change in the threshold voltage during the threshold voltage change processing, the two execution modes including a first execution mode in which the amount of change in the threshold voltage is greater and a second execution mode in which the amount of change in the threshold voltage is smaller; and at a point at which a sign of the offset voltage inverts, or at a point at which a level of the offset voltage becomes less than a tolerance, the control section switches the first execution mode to the second execution mode This configuration makes it possible to quickly cancel offset of the differential signal while making no sacrifice of the precision of the offset cancellation processing.

It is preferable that in the optical receiver according to the present embodiment, at a point at which a sign of the offset voltage inverts, or at a point at which a level of the offset voltage becomes less than a tolerance, the control section reduces a frequency at which the offset cancellation processing is executed.

This configuration makes it possible to reduce the load of the above control section while making no sacrifice of the speed of the offset cancellation processing.

It is preferable that the optical receiver according to the present embodiment include two or more sets of the transimpedance amplifier, the differential amplifier, and the no-signal detection circuit, the two or more sets corresponding to two or more channels, respectively; and at a point at which there is no longer a channel in which a sign of the offset voltage has not yet inverted, or at a point at which there is no longer a channel in which a level of the offset voltage has not decreased to less than a tolerance, the control section reduces a frequency at which the offset cancellation processing is executed.

This configuration makes it possible to reduce the load of the above control section while making no sacrifice of the speed of the offset cancellation processing.

It is preferable that in the optical receiver according to the present embodiment, the control section writes a value of the threshold voltage to a nonvolatile memory either at the time when operation of the control section ends or periodically during the operation of the control section; and at the time when the operation of the control section commences next, the control section reads out, from the nonvolatile memory, the value of the threshold voltage, and uses, as an initial value for the offset cancellation processing, the value of the threshold voltage that has been read out.

This configuration makes it possible to quickly cancel offset of the above differential signal even in a case where power of the above optical signal changes over time concurrently with deterioration, over time, of a light emitting element provided in an optical transmitter, or concurrently with some other factor.

It is preferable that in the optical receiver according to the present embodiment, the no-signal detection circuit includes a clear-on-read register in which a value of an LOS signal is stored, the LOS signal indicating the no-signal section; and the control section reads out the value of the LOS signal and identifies the non-signal section by referring to the value of the LOS signal.

This configuration makes it possible to prevent the control section from executing the threshold voltage change processing in a signal section whose duration is shorter than a cycle of readout, by the control section, of the value of the LOS signal. For example, in a case where the present embodiment is applied in serial communications in conformance with SAS, it is possible prevent the control section from executing the threshold voltage change processing in a section in which a COMINIT signal, a COMSAS signal, and an SNT signal is received.

Note that an active optical cable including the above optical receiver is also within the scope of the present embodiment. In such an active optical cable, it is possible to estimate, in advance, a range of fluctuation of received power in one connector (i.e., in a connector functioning as the optical receiver), such an estimation being based on the temperature characteristics of a light emitting element included in the other connector (i.e., in another connector functioning as an optical transmitter). Because of this fact, in the active optical cable, it easy to realize the offset cancellation processing that uses a predetermined program. Thus, the active optical cable is suited for application of the present embodiment thereto.

A control method for the optical receiver according to the present embodiment is a control method for an optical receiver, the optical receiver including: a photodetector element that converts an optical signal into an electric current signal; a transimpedance amplifier that converts the electric current signal into a voltage signal; and a differential amplifier that converts the voltage signal into a differential signal, by differential amplification of a difference between the voltage signal and a threshold voltage, the control method comprising the step of repeatedly executing offset cancellation processing, the offset cancellation processing including threshold voltage change processing in which the threshold voltage is changed such that an offset voltage of the differential signal is reduced, the threshold voltage change processing being skipped in a no-signal section of the optical signal.

In other words, a control method for the optical receiver according to the present embodiment is a control method for an optical receiver, the optical receiver including: a photodetector element that converts an optical signal into an electric current signal; a transimpedance amplifier that converts the electric current signal into a voltage signal; and a differential amplifier that converts the voltage signal into a differential signal, by differential amplification of a difference between the voltage signal and a threshold voltage, the control method including the steps of: (i) detecting a no-signal section of the optical signal; and (ii) performing control by repeatedly executing offset cancellation processing, the offset cancellation processing, when being performed outside the no-signal section, including threshold voltage change processing in which the threshold voltage is changed such that an offset voltage of the differential signal is reduced, and the offset cancellation processing, when being performed in the no-signal section, not including the threshold voltage change processing.

The above configuration makes it possible to cancel offset of the differential signal while causing no distortion of a waveform of a voltage signal immediately after the start of a signal section that follows a no-signal section.

[Additional Remark]

The present invention is not limited to the embodiments described herein, but can be altered by a skilled person in the art within the scope of the claims. That is, an embodiment derived from a proper combination of technical means appropriately modified within the scope of the claims is also encompassed in the technical scope of the present invention.

INDUSTRIAL APPLICABILITY

An optical receiver according to the present invention can be used suitably in serial communications in conformance with standards specifying transmission and reception of an OOB signal, a signal including an EI section, or the like, for example, SAS 2.0 or PCIe 3.0.

REFERENCE SIGNS LIST

1 Optical receiver
11 Photodetector element
12 Receiving circuit
12a Transimpedance amplifier
12b Variable voltage source
12c Dummy transimpedance amplifier
12d Differential amplifier
12e Differential amplifier
12f Differential amplifier
12g Differential amplifier
12h Low-pass filter
12i Switch
12j Error amplifier
12k LOS detection circuit (No-signal detection circuit)
12m I2C interface
13 MCU (Control section)
13a Voltage readout section
13b LOS readout section
13c Threshold voltage changing section
13d Channel switching section
13e I2C interface
14 Nonvolatile memory
15 Reference voltage source
100 Active optical cable

The invention claimed is:

1. An optical receiver comprising:
a photodetector element that converts an optical signal into an electric current signal;
a transimpedance amplifier that converts the electric current signal into a voltage signal;
a differential amplifier that converts the voltage signal into a differential signal, by performing differential amplification of a difference between the voltage signal and a threshold voltage;
a no-signal detection circuit that detects a no-signal section of the optical signal; and
a control section that repeatedly executes offset cancellation processing, the offset cancellation processing including threshold voltage change processing in which the threshold voltage is changed such that an offset voltage of the differential signal is reduced,
the control section skipping the threshold voltage change processing in the no-signal section.

2. The optical receiver according to claim 1, further comprising a variable voltage source that generates the threshold voltage,
the control section changing the threshold voltage by controlling the variable voltage source.

3. The optical receiver according to claim 1, wherein:
the no-signal detection circuit includes a clear-on-read register in which a value of an LOS (Loss of Signal) signal is stored, the LOS signal indicating the no-signal section; and
the control section reads out the value of the LOS signal and identifies the non-signal section by referring to the value of the LOS signal.

4. The optical receiver according to claim 3, wherein:
the optical signal includes a first optical signal that has significance as a signal in terms of a signal section duration, and a second optical signal that has significance as a signal in terms of a signal section bit pattern, the second optical signal having a signal section duration longer than the signal section duration of the first optical signal; and
the control section reads out the value of the LOS signal from the clear-on-read register, at a readout cycle that is set to be both longer than the signal section duration of the first optical signal and shorter than the signal section duration of the second optical signal.

5. The optical receiver according to claim 1, wherein:
the offset cancellation processing has two execution modes which are different from each other in an amount of change in the threshold voltage during the threshold voltage change processing, the two execution modes including a first execution mode in which the amount of change in the threshold voltage is greater and a second execution mode in which the amount of change in the threshold voltage is smaller; and
at a point at which a sign of the offset voltage inverts, or at a point at which a level of the offset voltage becomes less than a tolerance, the control section switches the first execution mode to the second execution mode.

6. The optical receiver according to claim 1, wherein:
at a point at which a sign of the offset voltage inverts, or at a point at which a level of the offset voltage becomes less than a tolerance, the control section reduces a frequency at which the offset cancellation processing is executed.

7. The optical receiver according to claim 1, wherein:
the optical receiver includes two or more sets of the transimpedance amplifier, the differential amplifier, and the no-signal detection circuit, the two or more sets corresponding to two or more channels, respectively; and
at a point at which there is no longer a channel in which a sign of the offset voltage has not yet inverted, or at a point at which there is no longer a channel in which a level of the offset voltage has not decreased to less than a tolerance, the control section reduces a frequency at which the offset cancellation processing is executed.

8. The optical receiver according to claim 1, wherein:
the control section writes a value of the threshold voltage to a nonvolatile memory either at the time when operation of the control section ends or periodically during the operation of the control section; and at the time when the operation of the control section commences next, the control section reads out, from the nonvolatile memory, the value of the threshold voltage, and uses, as an initial value for the offset cancellation processing, the value of the threshold voltage that has been read out.

9. An active optical cable comprising an optical receiver according to claim 1.

10. A control method for an optical receiver, the optical receiver including:

a photodetector element that converts an optical signal into an electric current signal;

a transimpedance amplifier that converts the electric current signal into a voltage signal; and a differential amplifier that converts the voltage signal into a differential signal, by performing differential amplification of a difference between the voltage signal and a threshold voltage, the control method comprising the steps of:

(i) detecting a no-signal section of the optical signal; and (ii) performing control by repeatedly executing offset cancellation processing, the offset cancellation processing including threshold voltage change processing in which the threshold voltage is changed such that an offset voltage of the differential signal is reduced, the step (ii) skipping the threshold voltage change processing in the no-signal section of the optical signal.

* * * * *